(12) United States Patent
Flatley et al.

(10) Patent No.: US 11,026,331 B1
(45) Date of Patent: *Jun. 1, 2021

(54) SPACECUBE V3.0 SINGLE-BOARD COMPUTER

(71) Applicant: United States of America as represented by the Administrator of NASA, Washington, DC (US)

(72) Inventors: Thomas Flatley, Greenbelt, MD (US); Alessandro Giest, Greenbelt, MD (US); David Petrick, Greenbelt, MD (US); Gary Crum, Greenbelt, MD (US); Milton Davis, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/586,210

(22) Filed: Sep. 27, 2019

(51) Int. Cl.
*H05K 1/00* (2006.01)
*H05K 1/18* (2006.01)
*H05K 7/00* (2006.01)
*H05K 1/11* (2006.01)
*G06F 11/10* (2006.01)

(52) U.S. Cl.
CPC ........... *H05K 1/18* (2013.01); *G06F 11/1076* (2013.01); *H05K 1/113* (2013.01); *H05K 2201/09309* (2013.01); *H05K 2201/09509* (2013.01); *H05K 2201/10015* (2013.01); *H05K 2201/10159* (2013.01); *H05K 2201/10189* (2013.01); *H05K 2201/10212* (2013.01); *H05K 2201/10545* (2013.01)

(58) Field of Classification Search
USPC ......................................................... 361/748
See application file for complete search history.

(56) References Cited

U.S. PATENT DOCUMENTS

| 6,040,985 A * | 3/2000 | Arai ........................ H05K 1/029 |
| | | 174/255 |
| 7,613,902 B1 * | 11/2009 | Martin ................ G06F 15/7867 |
| | | 712/201 |
| 9,851,763 B1 * | 12/2017 | Petrick ................. H05K 1/0298 |

* cited by examiner

*Primary Examiner* — Andargie M Aychillhum
(74) *Attorney, Agent, or Firm* — Heather Goo; Bryan A. Geurts; Helen M. Galus

(57) ABSTRACT

A single-board computer system radiation hardened for space flight includes a printed circuit board (PCB) having a top side and bottom side; a reconfigurable field programmable gate array (FPGA) processor device a connector disposed on the top side; a plurality of peripheral components mounted on the bottom side, wherein AC coupling capacitors are configured to select routing between the first FPGA and the second FPGA. An expansion card plug attaches to a connector on the bottom of the PCB and a frame is mounted to the PCB.

11 Claims, 8 Drawing Sheets

200

SPACECUBE V3.0 SINGLE-BOARD COMPUTER

The invention described herein was made by an employee of the United States Government and may be manufactured and used by or for the Government of the United States of America for governmental purposes without the payment of any royalties thereon or therefor.

FIELD

The aspects of the present disclosure relate generally to electronic components for use in spaceflight, and in particular, to a compact design data processor suitable for spaceflight.

BACKGROUND

Many space-based science missions require "next generation" on-board processing capabilities to meet the specified goals of each mission. These missions use advanced instrumentation systems such as laser altimeter, radar, lidar, and hyper-spectral instruments, which require advanced on-board processing capabilities to facilitate the timely conversion of planetary or earth science data into planetary or earth science information. Traditional space-processing systems do not have the processing power required by these advanced information systems. Both an "order of magnitude" increase in processing power and the ability to "reconfigure on the fly" are required to implement algorithms that detect and react to events, to produce data products on-board for applications such as direct downlink, quick look, and "first responder" real-time awareness, to enable "sensor web" multi-platform collaboration, and to perform on-board "lossless" data reduction by migrating typical ground-based processing functions on-board, thereby reducing on-board storage and downlink requirements.

The SpaceCube™ family of computers are reconfigurable, modular, compact, multi-processing platform for space flight applications demanding extreme processing power. It includes a Field Programmable Gate Array (FPGA) based on-board science data processing system developed at the NASA Goddard Space Flight Center (GSFC). The goal of the SpaceCube™ program is to provide one to two orders of magnitude improvements in on-board computing power while lowering relative power consumption and cost. The SpaceCube™ design strategy incorporates commercial radiation-tolerant FPGA technology and couples this technology with an upset mitigation software architecture to provide "order of magnitude" improvements in computing power over traditional radiation-hardened flight systems.

Achieving these goals will require using newly available FPGAs and other devices, which have increased numbers of input and output (I/O) pins and mounting devices. Spacecraft volume is a valuable commodity on space missions. Therefore, it is also important to keep the PCBs as small as possible and increase the part density mounted on each board. Large improvements in processing capability lead to use of processing elements that require a significant increase in the number of external interconnections needed on the processor boards. Existing connectors used for space flight do not provide the density of contacts needed to provide the increased interconnect requirements of the improved processing boards.

It is important to use high quality PCBs in equipment included in space missions. A PCB is an assembly that mechanically supports and electrically connects electronic components using conductive tracks, pads, and other features etched from sheets of conductive material, typically copper or other suitable conductive metals, laminated onto a non-conductive substrate. To achieve a very high quality, PCBs intended for space flight are typically designed to meet industry quality standards such as IPC 6012B Class 3/A for military and/or space avionics circuits. Alternatively, IPC 6012C Class 3/A may be used as a standard.

IPC is a standards developing organization accredited by the American National Standards Institute whose aim is to standardize the manufacture of electronic equipment. Having a high-quality PCB manufactured to well defined and trusted standards gives the customer a higher confidence that the PCB will survive the environmental stresses found in space environments and meet its lifetime requirements. Until recently, designing to the Class 3/A standard has not been as challenging a process. Modern PCBs often have multiple layers of conductive material and non-conductive substrate to allow muting of higher numbers of signals on densely populated boards. Designers typically use one side of the PCB for the majority of parts, and these "older" parts are in packages that make it fairly easy to meet the Class 3/A requirement. However, it is becoming more standard to use both sides of the board in order to reduce mass and increase performance. In addition, part manufacturers are cramming more I/O pins into packages and increasing the pin density. This change makes designing to the Class 3/A quality standard difficult, especially for packages that contain 100 to 2000 pins. Using standard practices for building new-age spaceflight circuit boards currently adopted by space equipment providers such as GSFC makes it impossible to meet the Class 3/A requirements. PCB designs typically run into difficulty when changes made to meet one aspect of the Class 3/A standard cause other aspects to be violated, thereby making it difficult and often impossible to meet the full requirements of the standard.

Typical space platforms, such as those developed in the SpaceCube™ program, require multiple boards to make up a complete system. In a space platform that has very strict size and weight requirements, the use of multiple electronic circuit boards can exceed these size and weight requirements. Additionally, the need to use multiple circuit boards to make up a complete data processing system increases design and packaging complexity.

Some programs can use commercial off the shelf components for its electronics. However, while some of these components may be smaller in size, they may be limited in their data processing performance. Other commercial products that may be small in size do not meet the stringent requirements for space flight. Also, computer processor and card architectures for use in space flight must also meet rigid requirements. Earth-space science missions require high end data computation and performance that is not available in other space processors. Processors and boards for space flight and missions must be configured in an architecture that is suited to handle radiation upsets while satisfying thermal and mechanical constraints and requirements.

Accordingly, it would be desirable to provide a single-board computer system that addresses at least some of the challenges identified above.

BRIEF DESCRIPTION OF THE DISCLOSED EMBODIMENTS

As described herein, the exemplary embodiments overcome one or more of the above or other disadvantages known in the art.

One aspect of the exemplary embodiments relates to a single-board computer system radiation hardened for spaceflight. In one embodiment, the single-board computer system includes a printed circuit board (PCB) having a top side and bottom side; a reconfigurable field programmable gate array (FPGA) processor device disposed on the top side; a connector disposed on the top side; and a plurality of peripheral components mounted on the bottom side, wherein a size of the single-board computer system is not greater than approximately 10 cm×22 cm.

Another aspect of the disclosed embodiments is directed to a multi-layer PCB for a single board radiation hardened processing system. In one embodiment, the multi-layer PCB includes a top half a bottom half, and a center plane there between. A layout stack-up of the multi-layer PCB has a pair of ground layers, a pair of signal layers, and a pair of power layers on the top half and the bottom half of the PCB, a top layer and a bottom layer of the PCB including land pads for connecting electrical components to the PCB.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the present disclosure, and together with the general description given above and the detailed description given below, serve to explain the principles of the present disclosure. As shown throughout the drawings, like reference numerals designate like or corresponding parts.

DETAILED DESCRIPTION

Figure 1:
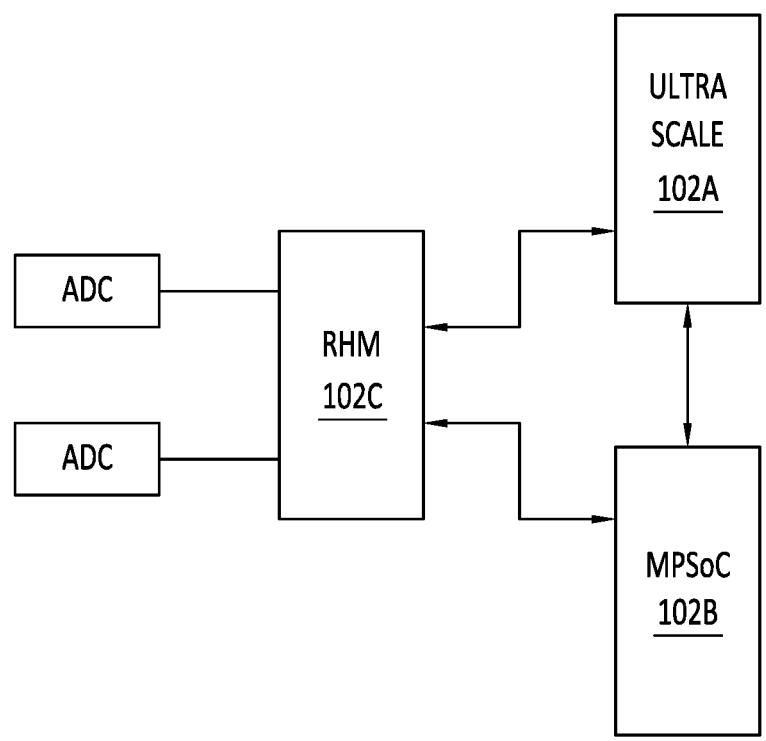
FIG. 1 illustrates a schematic block diagram with details of one embodiment of a system incorporating aspects of the present disclosure.

Referring to FIG. 1, a block diagram of one embodiment of a single-board computer system 100, including aspects of the disclosed embodiments is illustrated. The aspects of the disclosed embodiments are directed to an extremely small, low power, reconfigurable FPGA multi-processor system that is based on two core technologies, combining both the Xilinx Kintex Ultrascale and the Xilinx Zynq MPSoC+, and is suitable for spaceflight. The single-board computer system 100 of the disclosed embodiments is directed to small systems that require significant data processing capability and is built with radiation tolerant and/or hardened space quality parts. A unique layout strategy of the printed circuit board (PCB) allows for unlike parts to be placed in a back-to-back configuration to minimize the real estate of the PCB, also referred to as a printed wiring board. Although the embodiments disclosed herein will be described with reference to the drawings, it should be understood that the embodiments disclosed herein can be embodied in many alternate forms. In addition, any suitable size, shape, or type of elements or materials could be used.

As is illustrated in FIG. 1, in one embodiment, the single-board computer system 100 includes a field programmable gate array (FPGA) device 102. In one embodiment, the FPGA device 102 combines the Xilinx Kintex UltraScale, a 20 nm FGPA 102a, with the Xilinx Zynq MPSoC+, a dual-core 64-bit ARM Cortex-A53, dual-core Cortex-R5, 16 nm FinFET+ FPGA 102b, and a radiation-hardened monitor (RHM) 102c. In the SpaceCube v1.0 and SpaceCube v2.0 102c featured the Cobham Aeroflex UT6325 radiation-hardened FPGA, while the SpaceCube v3.0 uses the Microsemi RTAX FPGA.

In an embodiment, FPGA 102a may have two 2 GB DDR3 SDRAMs, which may have a width of 72. FPGA 102a may also have a 16 GB NAND flash memory. FPGA 102a may have a plurality of external interfaces, such as 24 multi-gigabit transceivers. FPGA 102a may either have 82 LVDS pairs or 164 1.8 V single-ended I/O interfaces. FPGA 102a may further have either 30 3.3 V single-ended I/O interfaces and eight RS-422/LVDS SpaceWire interfaces. For debug interfaces, FPGA 102a may have two RS-422 UART/JTAG interfaces.

In an embodiment, FPGA 102b may have a quad-core ARM Cortex-A53 processor that is configured to operate at 1.3 GHz and a dual ARM R5 processor that is configured to operate at 533 MHz. FPGA 102b may further have a 2 GB DDR3 SDRAM with a width of 72 and a 16 GB NAND flash memory. FPGA 102b may have various external interfaces, such as I2C/CAN/GigE/SPIO/GPIO/SpaceWire interfaces and 16 Multi-Gigabit Transceiver (SRIO/PCIe/etc.) interfaces. For debug interfaces, FPGA 102b may have 10/100/1000 Ethernet for non-flight purposes, and otherwise use two RS-422 UART/JTAG interfaces.

FPGA device 102 is high-performance, radiation hardened, and reconfigurable for processing computation-intensive space systems. Both FPGA 102a and FPGA 102b may be in-flight reconfigurable, allowing for extreme adaptability to meet dynamic mission objectives. In one embodiment, the single-board computer system 100 of the disclosed embodiments is configured to execute around 20,000 times greater Giga-Operations Per Second (GOPS) than other comparable space processors such as the BAE RAD750.

Algorithms can be implemented in both FPGA 102a and FPGA 102b. More sequential or control-flow oriented portions of the algorithm can be implemented quickly and efficiently on the high-performance ARM processors while other algorithms that are more parallel in nature and computation heavy can be accelerated in the fabric of both FPGA 102a and FPGA 102b. In this hybrid system, each piece can be optimally implemented to take advantage of the features of both FPGA 102a and FPGA 102b.

The MPSoC multi-core processor in FPGA 102b may provide a 30-250× speedup over the embedded processors in the SpaceCube v2.0 while FPGA 102a is a significant upgrade in both performance and FPGA resources over the Virtex-5 FPGA used in the SpaceCube v2.0. Furthermore, the technology of the FPGA 102a is more radiation tolerant than the commercial Xilinx Virtex-5 FPGA.

Figure 2:
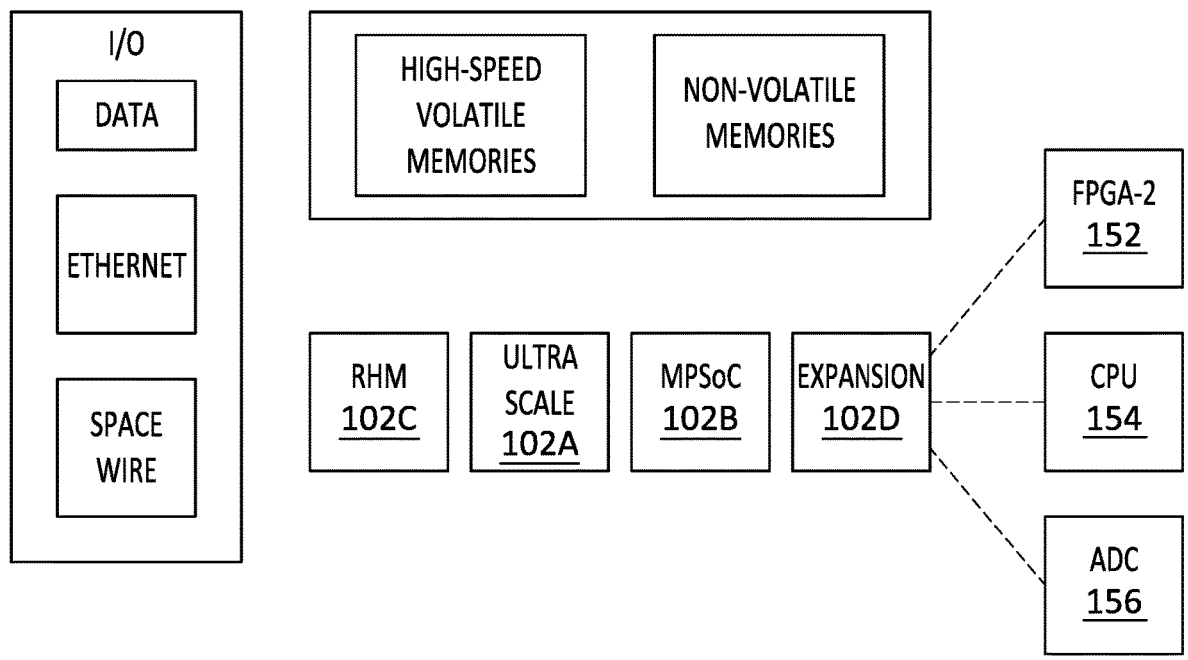
FIG. 2 illustrates a schematic block diagram with additional details of one embodiment of a system incorporating aspects of the present disclosure.

FIG. 2 illustrates additional details related to FIG. 1.

Xilinx FPGAs 102a/102b are low-cost, rad-tolerant components, but the rest of the system may be designed with a majority of NASA qualified flight parts and have features to mitigate radiation effects on the processor system. These are handled by the Rad-Hard Monitor (RHM) FPGA 102c which is a radiation hardened RTAX FPGA. The RHM 102c provides radiation mitigation and system monitoring in several ways. It can configure the FPGA 102a and scrub the configuration memory to clear any upsets. In addition, it may monitor the health of the MPSoC processors on FPGA 102b and any co-processors on the Expansion Card FIG. 1C 102d using watchdog timers.

The RHM 102c may use error detection and multiple redundant copies to mitigate against radiation upsets to the configuration files. The RHM 102c may monitor all the voltage rails on the board and also the current on the critical power rails through attached Analog-to-Digital Converters (ADCs). Due to the complexity of the FPGA power domains, and differences in voltage rail requirements between the devices, there are fifteen voltage regulators in the board design. Sharing of regulators is done where feasible to reduce the overall quantity of distinct voltage rails needed. Meeting the power sequencing order of the FPGAs is critical because otherwise it is possible to damage the device. For that reason, the system may be designed so that the RHM 102c powers on first, and then controls the power sequencing of the voltage rails to FPGAs 102a/102b. Doing so also allows the RHM to clear radiation-induced functional upsets in FPGAs 102a/102b without having to power-cycle the entire card, which might require a ground command depending on the mission operations. The RHM also monitors the current of the critical FPGA voltage rails in order to detect and react to radiation-induced high current events with a power-cycle of FPGAs 102a/102b.

The RHM 102c may host a SpaceWire Router which would connect externally through the backplane or front-panel connectors. The SpaceWire Router may connect to both FPGA 102a and the FPGA 102b. This feature allows the spacecraft to communicate directly to the RHM 102c, while also communicating with both FPGAs 102a/102b through the same interface.

The SpaceCube v3.0 may feature an expansion card option 102d that allows a tightly-coupled, mission-unique card to be installed directly on the processor card. The expansion card interface may take advantage of the VITA 57.4 FPGA Mezzanine Card Plus (FMC+) Industry Standard. The mission unique expansion card may support a variety of capabilities, such as A/D converters, D/A converters, Gigabit Ethernet, 1553, and additional co-processors.

In an embodiment, expansion card option 102d may be a plug-in module that further comprises a high-performance FPGA-2 152, a multi-many core CPU 154, and a high-speed A/D converter (ADC) 156. FGPA-2 152 may also include FPGA DSP logic and embedded soft-core CPUs. Multi-many core CPU 154 may include a high-performance space computer (HPSC). Other modules may be added to ADC 156. The capacities of the peripheral components referenced herein are merely exemplary, and in alternate embodiments, any suitable capacity devices can be used.

The backplane connector is a high-density connector that provides 3.3V, 5V, +/−12V power rails from the backplane card. The backplane connector I/O includes Multi-Gigabit Transceiver interfaces, LVDS, and GPIO. The system uses a VPX-style set of connectors for the backplane.

The typical size of the FPGA device 102a is approximately 4.5 centimeters×4.5 centimeters and the typical size of the FPGA size device 102b is approximately 3.5 centimeters×3.5 centimeters. In one embodiment, referring to FIG. 2 for example, the single-board computer system 100 of the disclosed embodiments has a size of approximately 10 centimeters×22 centimeters. The size of the single-board computer system 100 is configured to accommodate the connector 110 and provide a way to secure the single-board computer system 100 within a suitable structure.

Figure 3:
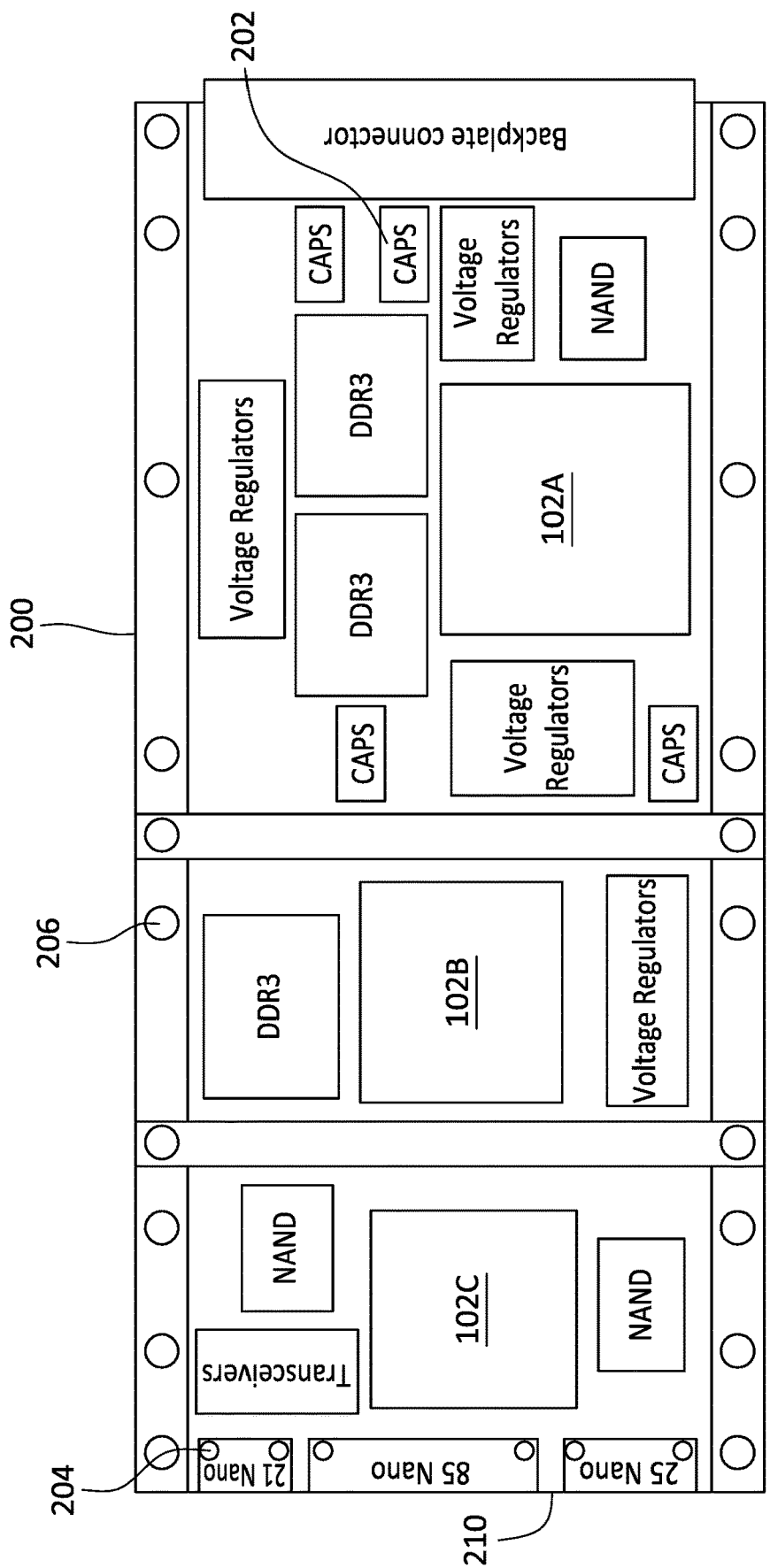
FIG. 3 illustrates a top side view of an embodiment of a system incorporating aspects of the present disclosure.

FIG. 3 illustrates a top side view of one embodiment of the single-board computer system 100. In this example, the top side 200 includes the FPGA device 102 and the connector 110. In one embodiment, the top side 200 can include other electronic components, such as capacitors 202. The top side 200 can also including mounting holes 204 through the connector 110 to the Printed Circuit Board (PCB) 210 to which the components of the single-board computer system 100 are mounted. Other through holes or thermal board interfaces or mounting holes 206 are provided for securing or clamping the single-board computer system 100 within a suitable frame or connector structure. The thermal board interfaces or mounting holes 206 can provide a primary heat path from the PCB 210 to the frame the wedge-locks attach to and a heatsink. A gasket material and heatsink with features that are designed to seat on each of the high-power parts to provide an improved thermal path.

Both FPGA 102a and FPGA 102b may have attached DDR3 SDRAM volatile memory that provide significant bandwidth for high-performance processing. The selected memories may have an extra byte to support EDAC (Error Detection and Correction) for improved radiation mitigation for spaceflight. These memories may be used for storing an operating system and dynamic application data, such as images or attached instrument data.

Both FPGA 102a and FPGA 102b may feature dozens of Multi-Gigabit Transceiver interconnects that route between FPGAs 102a/102b, to the backplane connectors, to the front-panel connectors, and even to the Expansion Card connector. These interconnects allow high volumes of data to be exchanged in short periods of time while minimizing board real estate for routing resources. Selectable routing of the MGT differential pairs to one destination or another may occur by rotating the AC coupling capacitors on the PCB. Thus, selectable routing is possible without loss to signal integrity.

The single-board computer system 100 of the disclosed embodiments employs a unique layout strategy that uses blind vias, symmetrical layer stackup, localized FPGA via breakouts, and trace routing.

In the single-board computer system 100 described with reference to FIG. 1 above, a pair of large FPGA devices are used to provide significant processing power and support the software mitigation functionality. The first FPGA device is packaged in a 1517-pin BGA or CGA device with a 1 mm pitch and the second FPGA device is packaged in an 1156-pin device with a 1 mm pitch., but other packaging schemes may be used and are contemplated. One major goal of the processing system 100 design technology is to keep board sizes as small as possible. In order to use the large BGA devices, there must be many signal layers so that all of the pins can escape from beneath the pin matrix.

The latest generation of FPGA devices have a higher power consumption than previous generations, and this advancement requires careful attention to the PCB stackup and design. The Xilinx FPGAs draw a large amount of current on the core voltage rail and the DDR3 1.5V rail. In order to accommodate the large current transients, plane mirroring is used on these rails. This technique is where the power plane is duplicated on an upper and lower layer in the stackup. Also, to reduce the number of power planes required, the two FPGAs share as many of the power rails as possible.

Figure 4:
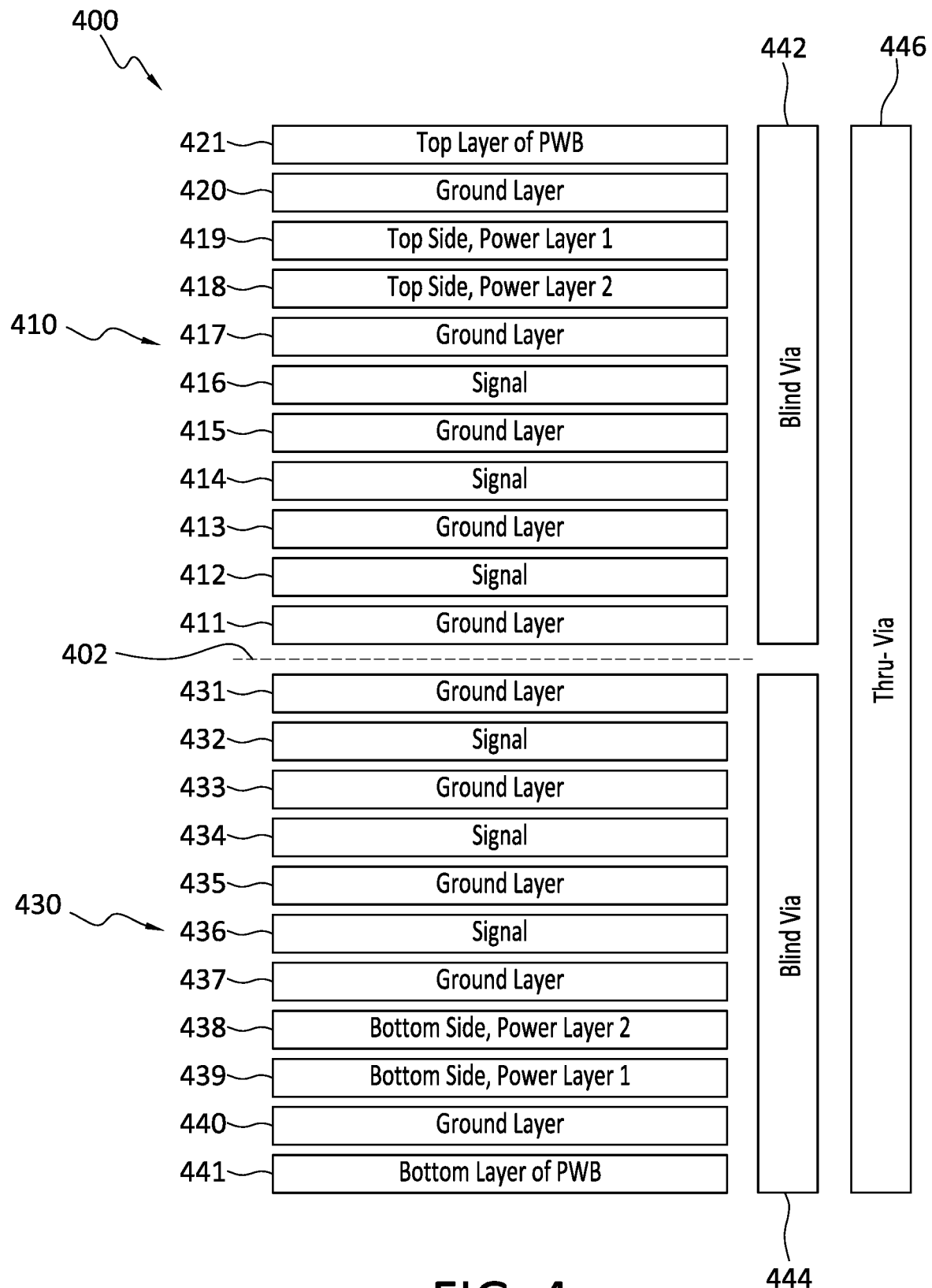
FIG. 4 illustrates a schematic diagram of one embodiment of two-halves of a printed circuit board layout stack-up for a system incorporating aspects of the present disclosure.

FIG. 4 illustrates one embodiment of the stack-up layout 400 of the PCB 210, also referred to as a printed wire board (PWB), for the single-board computer system 100. The layers of the PCB 210 are arranged symmetrically about a central plane 402, which is coplanar with the PCB 210. The embodiment of the PCB 210 in FIG. 4 is a multi-layer PCB 210 configured in a two-halves configuration. In this example, reference 402 indicates an approximate center or central plane of the PCB 210, the top half being referenced as 410 and the bottom half as 430. The "two-halves" configuration is a multi-layer PCB layer configuration where the layers of the PCB 210 are arranged symmetrically about a central plane 402, which is coplanar with the PCB 210. In the two-halves configuration, the bottom half 430 can have the same configuration of layers as the top half 410, mirrored about the central plane 402. The top layer 421 of the PCB 210 and bottom layer 441 in the layout 400 include the mounting or land pads for connecting electronic components to the PCB 210 as well as signal paths and other features. The term "feature" refers to a geometry of the conductive material and insulating layers formed on or within the PCB 210.

The stack-up layout 400 shown in FIG. 4 includes 22 layers. Ten of the layers are ground layers, referenced as 420, 417, 415, 413, 411, 431, 433, 435, 437, and 440. There are four power layers 419, 418, 438, and 439. There are six signal layers 416, 414, 412, 432, 434, and 436. There are also a top layer 421 and a bottom layer 441. The power layers 419, 418, 438, and 439 are sandwiched between ground planes of the PCB 210 to eliminate split planes being the signal reference.

The stack-up layout 400 of FIG. 4 also includes blind vias 442 and 444 and a through-via, or through-hole via 446. With the two-halves board configuration shown in the layout 400 of FIG. 4, many of the via-in-pad features require only blind vias 442 and 444 going no more than halfway through the PCB 210 allowing a smaller via diameter to be used. A through via 446 is used to connect to multiple power and ground planes where plane mirroring is used to improve power integrity and support higher current consumption.

Certain considerations must be addressed in the layout stack-up of the PCB 210. One of these considerations is use of via-in-pad required to breakout the FPGA devices 102a and 102b as well as the other major BGA devices (such as the DDR3 SDRAM memory). Due to the component density of the PCB, through vias are minimized to allow placement of components on opposite sides of the board. This design maximizes use of the PCB real estate.

All signals going to a component on the opposite sides of the PCB 210 must use a through-hole via, such as 446. The part placement of the peripheral components on the bottom side 220 of the PCB 210 must be such so that the through-hole vias for the FPGA devices 102a, 102b, the DDR3 memories, and the Rad-Hard Monitor are localized under each component.

The peripheral components, such as those shown in FIG. 3, can use blind vias for electrical connections. Signal layers may require a reordering of pinouts in order to allow maximum use of routing to eliminate any unnecessary vias.

Figure 5:
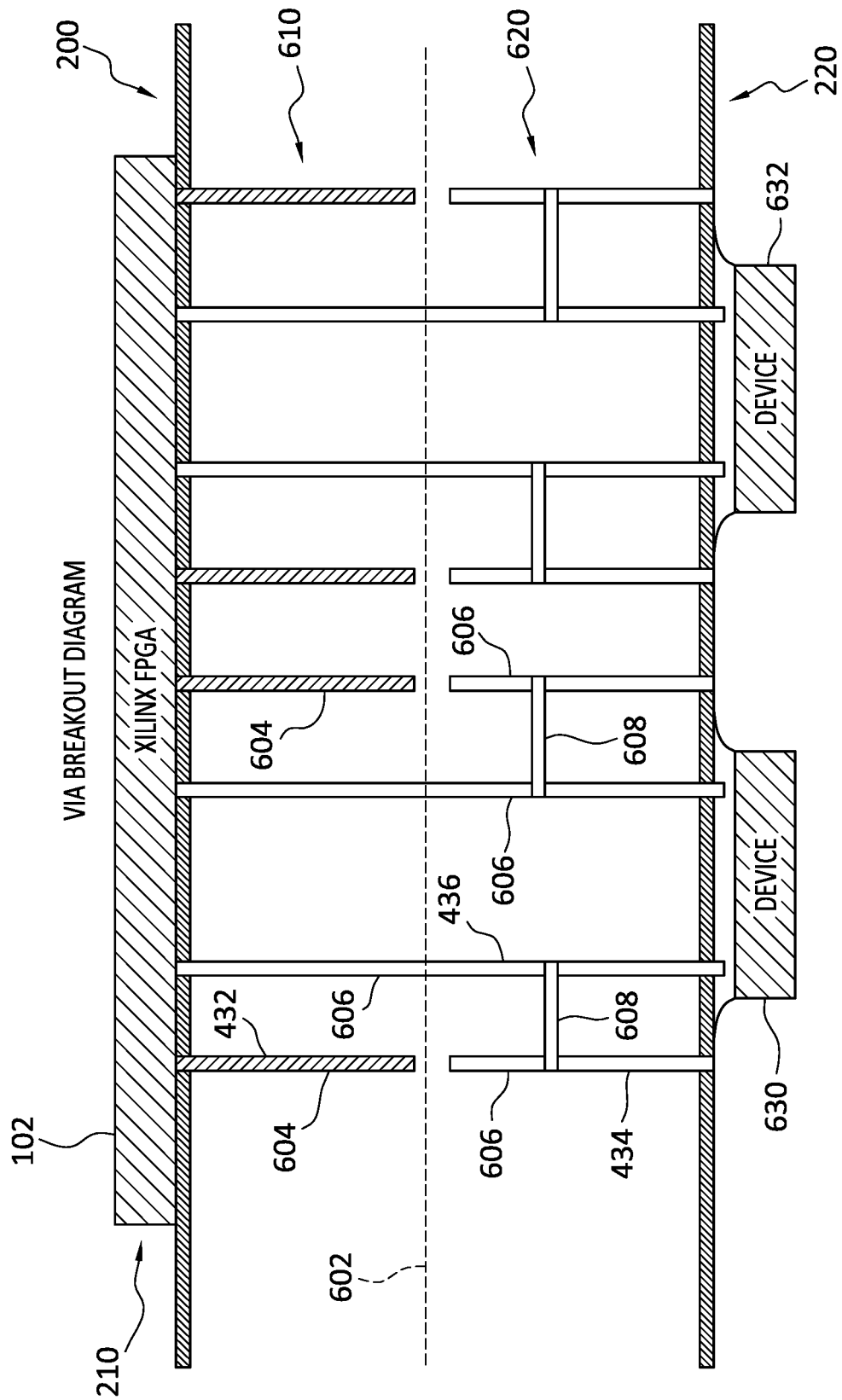
FIG. 5 illustrates a schematic view a via breakout layout for one embodiment of a printed circuit board layout stack-up for a system incorporating aspects of the present disclosure.

FIG. 5 illustrates an exemplary via breakout diagram for one embodiment of the PCB 210 illustrated in FIG. 2. The power and ground vias are generally referenced as 604, while the signal breakout vias are referenced as 606. An approximate center or center plane of the PCB 210 is referenced as 602, which divides the PCB 210 into an upper or top portion 610, and a lower or bottom portion 620.

As shown in the FPGA device 102 is disposed on the top side 200 of the PCB 210. Peripheral components or devices 630, 632, are disposed on the bottom side 220 of the PCB 210. In the example of FIG. 5, the power and ground vias 604 in the top portion 610 are blind vias 432, while the signal breakout vias 606 in the bottom portion 620 include a combination of blind vias 434 and through vias 436.

In order to accommodate the through vias 436, the devices 630, 632 are offset or raised above a surface of the bottom side 220 of the PCB 210. The devices 630, 632 need to be positioned or placed to allow for the through vias 436 to "pop" through, without either electrically or physically contacting the bottoms of the devices 630, 632. In one embodiment, the devices 630, 632 are positioned a distance above the surface of the bottom side 220 of the PCB 210 that is greater than approximately 0.010 inches. In alternate embodiments, the devices 630, 632 can be positioned at any suitable distance above the surface of the bottom side 220 of the electronic circuit board 210 that can ensure that the bottoms of the devices 630, 632 do not make either electrical or physical contact with the through vias 436 that pop through under the devices 630, 632.

The orientation of the FPGA device 102 on the top side 200 of the PCB 210 does not allow for through vias to be used from the bottom side 220. The I/O vias 608 are then "clustered" underneath each one of the bottom side 220 devices 630, 632. Traces on the bottom side 220 of the PCB 210 connect the through vias 436 to a blind via 434 in the desired fashion.

Figure 6:
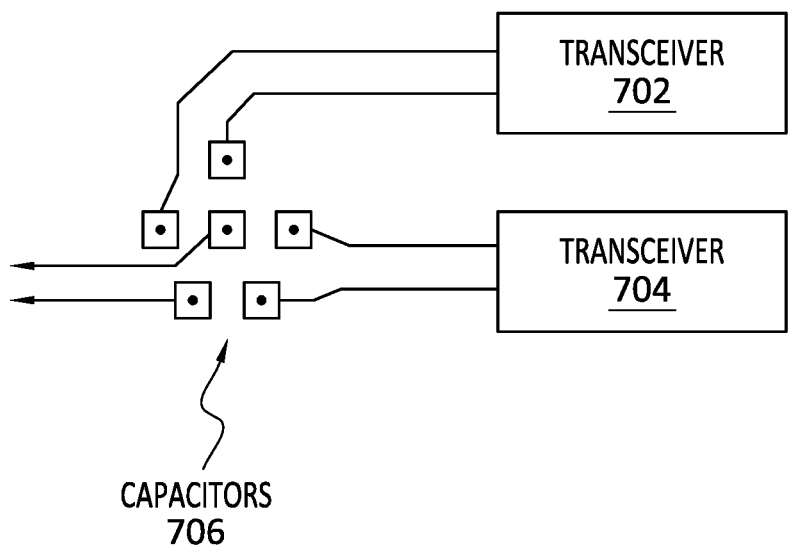
FIG. 6 illustrates a multi-gigabit transceiver split routing diagram.

FIG. 6 illustrates a Multi-Gigabit Transceiver split routing diagram.

A first transceiver 702 may be coupled to a second transceiver 704 by means of a split routing architecture applicable for multi-gigabit frequencies. As depicted in FIG. 6, AC-coupling capacitors 706 may be used to select routing between first transceiver 702 and second transceiver 704. The AC-coupling capacitors 706 may be required by standards such as Serial Rapid IO and PCIe. By employing a topology with AC-coupling capacitors 706, stub traces may be eliminated, thereby helping to maintain the required signal integrity.

Transceivers 702 and 704 may be applicable to interconnects that route between the MPSoC FGPA 102b and Ultra-Scale FPGA 102a, to backplane connectors, and to an Expansion Card connector. These interconnects may allow high volumes of data to be exchanged in short periods of time while minimizing board real estate for routing resources. This also allows a finite number of MGT transceivers to be extended to additional destinations via configuration.

The SpaceCube v3.0 (SCv3.0) design uniquely introduces the combination of a high capacity FPGA, a high performance SoC (System-on-Chip), and reliable FPGA supervisor. This section describes the architecture and key features of the SCv3.0 processor card.

Figure 7:
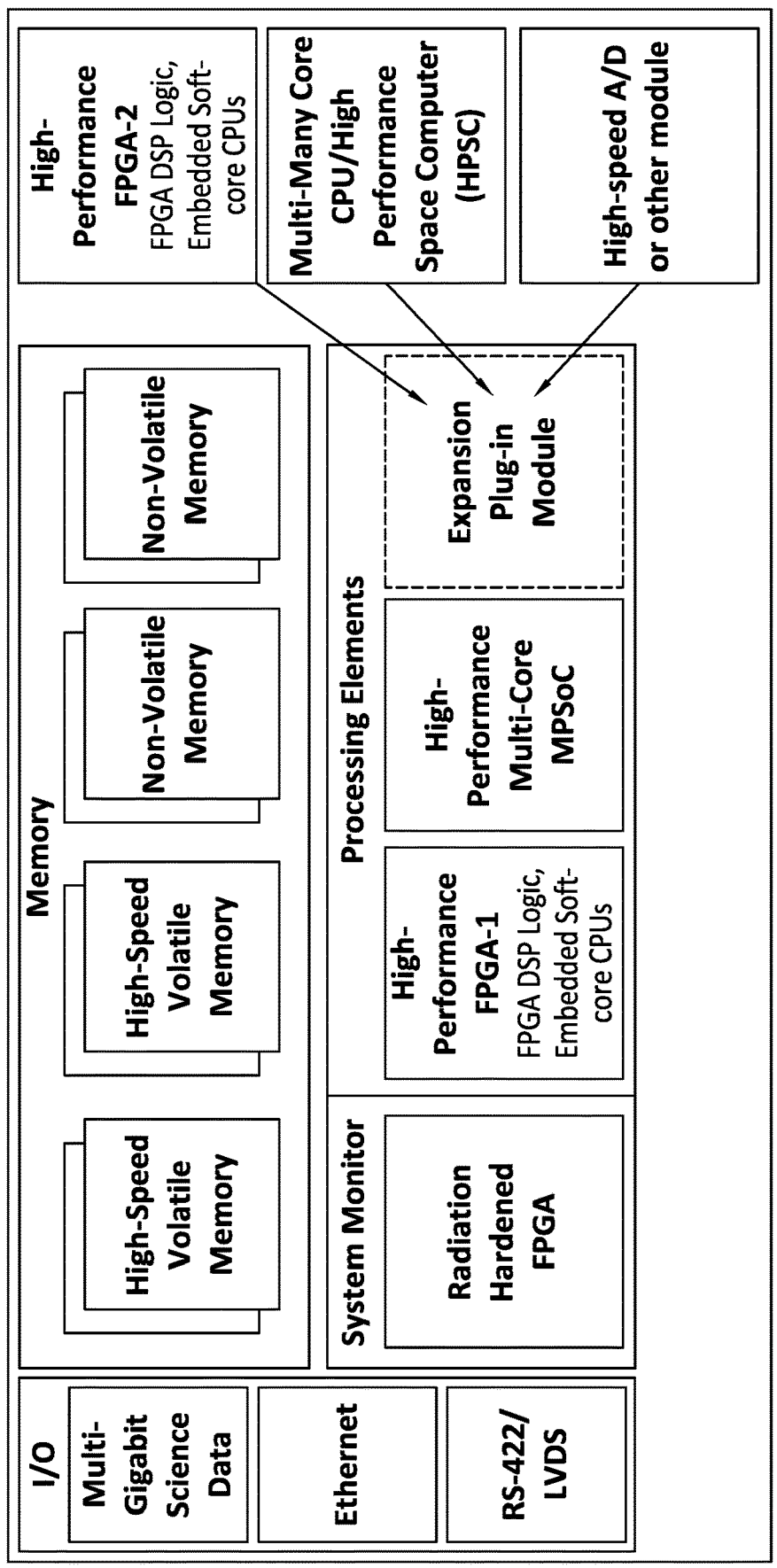
FIG. 7 illustrates a high-level block diagram of a processor card.

A high-level block diagram of primary components is depicted in FIG. 7. The SpaceCube v3.0 is a SpaceVPX Lite (VITA 78.1) 3U-220 mm form-factor card featuring two core technologies, combining a Xilinx Kintex UltraScale (20 nm FPGA) with a Xilinx Zynq MPSoC (quad-core 64-bit ARM Cortex-A53, dual-core Cortex-R5, 16 nm FinFET+ FPGA) to provide powerful fixed-logic processors with vast amounts of reconfigurable-logic FPGA resources. The Kintex UltraScale FPGA and Zynq MPSoC are in-flight reconfigurable which allows for extreme adaptability to meet dynamic mission objectives, while the rad-hard supervisor provides reliable operation and monitoring.

The architecture of the SCv3.0 is versatile for porting and mapping algorithms to the design because they can benefit from both the extensive reconfigurable fabric of the Kintex UltraScale FPGA and the high-performance ARM processors in the Zynq MPSoC. Hybrid architectures are advantageous for algorithm acceleration because sequential or control flow portions of an algorithm can be implemented quickly and efficiently on the quad-core processors, while other dataflow-oriented algorithms that are highly parallel or are comprised of computation-heavy iterative operations can be accelerated in the FPGA fabric of both the Kintex UltraScale and the Zynq MPSoC. The Zynq MPSoC multi-core processor (ARM Cortex-A53) alone provides an immense speedup over the embedded processors in the SpaceCube v2.0 (IBM PowerPC440). CoreMark is a performance benchmark developed by the Embedded Microprocessor Benchmark Consortium, designed to replace the antiquated Dhrystone benchmark.

Table 1 displays the CoreMark scores of the processor architectures used by SpaceCube processors, and further highlights the significant computational margin increase from SpaceCube v2.0 to SpaceCube v3.0. Additionally, the Kintex UltraScale FPGA device is a significant upgrade in both performance and FPGA resources over the Virtex-5 FPGA.

TABLE 1

CoreMark Results for SpaceCube Devices

| Processor | Configuration | CoreMark |
|---|---|---|
| MicroBlaze (Softcore FPGA Fabric) | Xilinx v8.20b Virtex-5, 5-Stage Pipeline 16 K/16 K Cache 125 MHz | 238[1] |
| IBM PowerPC 405 (SpaceCube v1.0 Virtex-4) | 300 MHz | 664.79[1] |
| IBM PowerPC 440 (SpaceCube v2.0 Virtex-5) | 400 MHz, Bus 100 MHz 125 MHz, Bus 125 MHz | 1155.62 361.13 |
| ARM Cortex-R5 (SpaceCube v3.0 Zynq MPSoC) | 500 MHz | 1286.03 |
| ARM Cortex-A53 (SpaceCube v3.0 Zynq MPSoC) | 1.2 GHz, —O3 1.2 GHz, —O2 | 16449.62[1] 15866.62 |

Table 2 shows a comparison of the FPGA logic resources available throughout the generations of SpaceCube processors.

TABLE 2

SpaceCube v3.0 FPGA Resources

| Resources | SpaceCube v1.0 | SpaceCube v2.0 (FX130 Ver.) | SpaceCube v2.0 FX200 Ver.) | SpaceCube v3.0 |
|---|---|---|---|---|
| LUTS (K) | 101 | 164 | 246 | 562 |
| FF (K) | 101 | 164 | 246 | 1124 |
| RAM (Mb) | 0.79 | 21 | 33 | 49 + 27 UltraRAM |
| DSPs | 256 | 640 | 768 | 4488 |

The SCv3.0 processor card features an expansion card option/plug-in module connector that allows tightly-coupled, mission-unique cards to be developed and interfaced directly to the processor card. This feature allows mission developers to expand the system as needed without an obligation to provide or develop a separate I/O card should the mission be unable to support that configuration for the avionics box. This expansion card interface takes advantage of the VITA 57.4 FPGA Mezzanine Card Plus (FMC+) industry standard which provides flexibility for testing and developing with available commercial cards already compliant with the standard. This FMC+ maintains backward compatibility with the standard FMC, however, it also breaks out a large number of Multi-Gigabit Transceiver (MGT) interfaces which, using the JESD204B standard, can interface with multi-giga-sample ADC/DACs. These ADCs/DACs are essential to implementing lidar, radar, communication, and other applications. The SpaceCube v3.0 expansion card, however, is not limited to FMC+dimensions and can accept larger cards if needed. Incorporating the mission-unique expansion card allows the SCv3.0 processor card to fullfill a number of roles as a powerful instrument processor, since ADC converters, DAC converters, Gigabit Ethernet, 1553, additional co-processors, etc. . . . can be interfaced directly to the card.

For memory storage resources, each of the three FPGAs has an attached flash memory for non-volatile storage. The NAND flash memory attached to the radiation-hardened monitor (RHM) stores configuration files, enabling the radiation-hardened monitor to configure and scrub the Kintex UltraScale FPGA. Each NAND flash memory attached to the Kintex UltraScale FPGA and MPSoC stores software applications, FPGA configuration files, and other application data. However, the Kintex UltraScale NAND flash memory is designed to optimize write throughput, due to the expectation of users to integrate sensors and high-throughput instruments to this device.

Both the Kintex UltraScale FPGA and Zynq MPSoC have attached DDR3 (×72-bit wide, 533 MHz) SDRAM volatile memory that provide significant bandwidth for high-performance processing. Two DDR3s are attached to the Kintex UltraScale and one DDR3 is attached to the ARM processing system side of the Zynq MPSoC. The selected memories have an extra byte to support EDAC (Error Detection and Correction) for improved radiation mitigation for space operation. These memories can be used for operating system storage, but also enable real-time application data processing, by buffering images, instrument data, and intermediate products.

The Xilinx FPGAs are low-cost, radiation-tolerant components; however, the remaining system is designed with NASA-qualified flight parts. To monitor Xilinx devices, the architecture includes a radiation hardened Microsemi RTAX FPGA to mitigate radiation effects across the system. This radiation-hardened monitor provides radiation mitigation and system monitoring through several means. The monitor can configure the Kintex UltraScale FPGA from up to 64 unique configuration files and scrub the configuration memory to correct any upsets. These configuration files can also be updated via ground commands to the monitor. It also uses error detection and redundant copies to mitigate radiation upsets to the Xilinx configuration files stored in the external non-volatile memories. In addition, it monitors the health of the Zynq MPSoC processors, the Kintex UltraScale FPGA, and any co-processors on the expansion card using watchdog timers.

The system has been deliberately designed so that the radiation-hardened monitor powers on first, and then controls the power sequencing of the numerous Xilinx FPGA voltage rails. In addition, the RHM monitors each voltage rail on the board and the current on critical power rails to aid in fault detection. This allows the Xilinx FPGAs to be power-cycled locally to clear any radiation-induced upsets. Due to this functionality, the radiation-hardened monitor can respond to ground commands even while the Xilinx FPGAs are unpowered, and does not require the entire card to be power-cycled. The radiation-hardened monitor also hosts a SpaceWire (SPW) router which connects externally through the backplane and front-panel connectors, and connects to the Kintex UltraScale and the Zynq MPSoC. This feature allows the spacecraft to communicate directly with the radiation-hardened monitor and both Xilinx FPGAs through the same interface.

The SpaceCube v3.0 advances the state-of-the-art of MGT quantity, routing, and performance for spaceflight. Both the Kintex UltraScale FPGA and Zynq MPSoC feature dozens of Multi-Gigabit Transceiver interconnects that route between the Zynq MPSoC and Kintex UltraScale FPGA, to the backplane connectors, and to the expansion card connector. These transceivers allow high volumes of data to be exchanged in short periods of time while minimizing the Printed Circuit Board (PCB) area for routing resources. Due to radiation-effects mitigations needed for the Zynq MPSoC, the expected system architecture deployment for the SCv3.0 processor card is to integrate high-speed sensor or instrument interfaces to the Kintex UltraScale, which will perform significant preprocessing before transferring the data to the Zynq over this high-bandwidth (8×MGT lanes) interface for higher order processing or additional pipelined algorithm stages. In addition, the SCv3.0 processor card includes an innovative technique that allows selectable routing of the MGT differential pairs to varying destinations.

Figure 8:
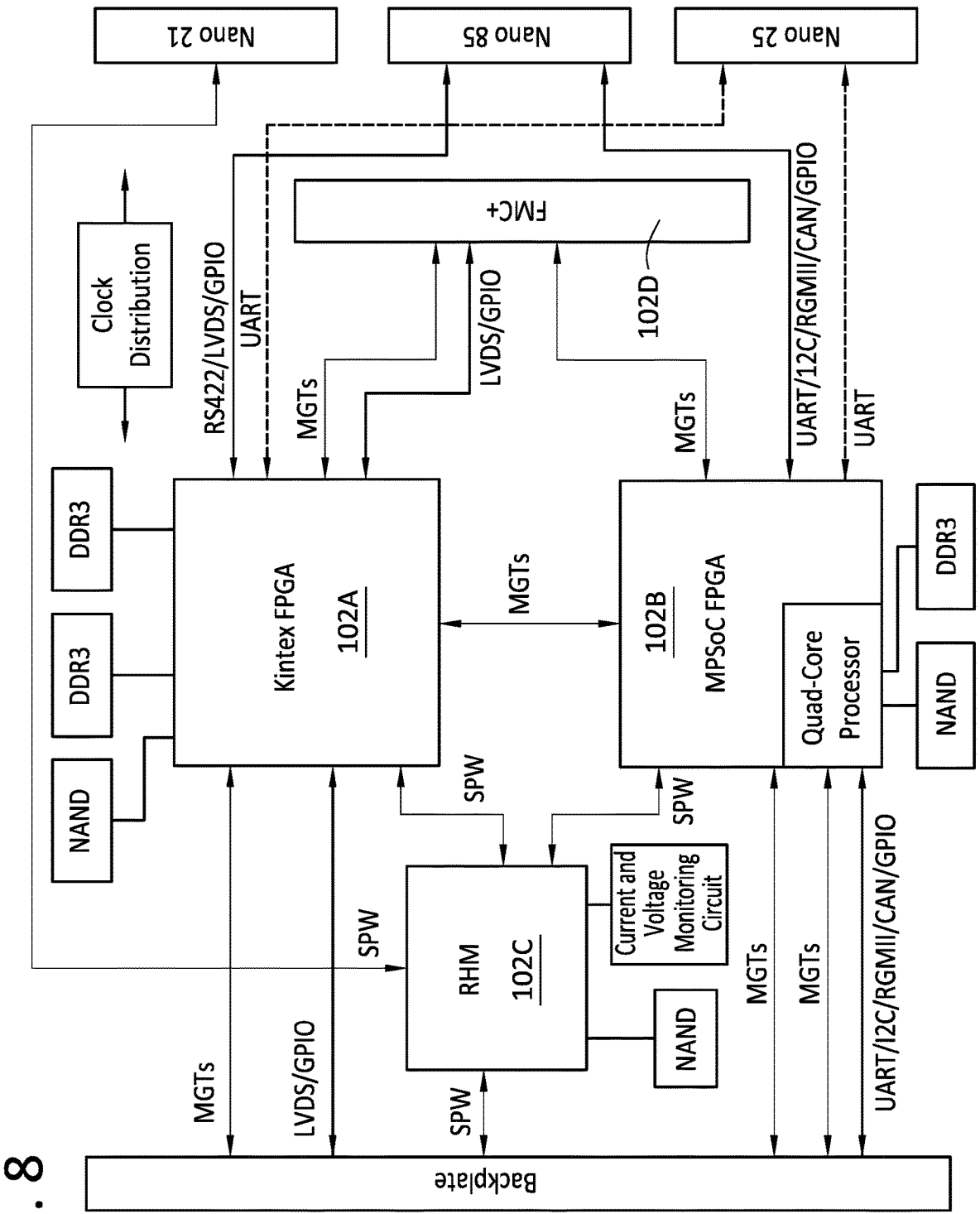
FIG. 8 illustrates a high-level view of the main interconnects.

A high-level view of the main interconnects is displayed in FIG. 8. The VPX backplane connector is a high-density connector that provides 3.3V, 5V, +/−12V power rails from the backplane card. The backplane connector I/O includes Multi-Gigabit Transceiver interfaces, LVDS, and GPIO. The VPX connector allows significantly faster signal rates than typical flight connectors. Finally, the SpaceCube v3.0 processor card also features a 25-pin Nano connector, a 21-pin Nano connector, and an 85-pin Nano connector that provide debug and flight interconnects. The HPSC rad-hard-by-design manycore processor, being co-developed by GSFC, AFRL, and JPL is targeted for a variant of the SpaceCube v3.0 processor card, replacing the Zynq MPSoC in the design. For more immediate integration of the HPSC with SpaceCube v3.0, a planned FMC+ Card in the expansion slot, will be in development when the chiplets are available.

The SCv3.0 processor card features two complex Xilinx devices, the Kintex UltraScale and the Zynq MPSoC. Following the results of the SpaceCubeX project, the SpaceCube team performed a thorough design trade before finalizing the selection of these devices. The Kintex UltraScale was selected primarily because of Xilinx's commitment to make the design its first 20 nm FPGA product for space applications with the XQRKU60 device. For the second device, the Zynq MPSoC was originally selected due to the initial support suggested by Xilinx for the ZU19EG as a Space Grade Device. Mitigation schemes have been suggested, a number of which have been incorporated into the design, to allow the MPSoC to be capable for space operation. Additionally, from a NASA strategic perspective, lessons for creating designs around the ARM Cortex-A53 would benefit the future HPSC.

The mechanical frame and front panel construction allows the SpaceCube v3.0 to conform to industry-leading MIL-STD specifications and NASA guidelines including GSFC-STD-7000 for sine vibration, random vibration, quasi-static, shock, thermal vacuum, and thermal cycling. The analysis successfully verifies the module is able to survive a 14.1 GRMS 3-sigma and 50 g static input load. The frame uses a fastened construction made of durable CNC machined 6061-T6 aluminum. All fasteners are stainless steel and all threaded holes have self-locking, stainless steel inserts to withstand severe vibration, shock, and multiple insertion/extraction cycles. The design accommodates multiple thermal design solutions to dissipate the heat.

For representative use-cases, the SCv3.0 processor card shows a power dissipation range from 22.6 to 45.8 W. Analysis designed to a 50 W worst case scenario has shown that use of the thermal design solution enables all assembled components to meet de-rated junction temperatures. The analysis was performed assuming the card module is installed in a standard aluminum electronics chassis with only the base controlled at 55 C.

The SpaceCube v3.0 processor card is an evolutionary advancement of spaceflight computing capability. This novel design integrates two complex, high-performance Xilinx devices with a radiation-hardened monitor to provide exceptional performance and reliability, in a commercial form factor. This design, following the SpaceCube design approach, leverages years of development experience from the highly successful SpaceCube v2.0. Therefore, this new processor card will provide a processing solution for next-generation needs in both science and defense missions.

Additionally, this design has been leveraged to construct the SpaceCube v3.0 Mini processor card, which transfers a subset of the SCv3.0 capability onto a 1U CubeSat form-factor card.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A single-board computer system radiation hardened for space flight, the single-board computer system comprising:
   a printed circuit board (PCB) having a top side and bottom side, the PCB comprising a plurality of layers arranged symmetrically in a two-halves configuration above and below a central plane of the PCB;
   a field programmable gate array (FPGA) device disposed on the top side, wherein the FPGA device comprises a first FPGA and a second FPGA;
   a connector disposed on the top side; and
   a plurality of peripheral components mounted on the bottom side, wherein AC coupling capacitors are configured to select routing between the first FPGA and the second FPGA and the layout stack-up of the top side of the PCB comprises:
      a first ground layer;
      a first signal layer over the first ground layer;
      a second ground layer over the first signal layer;
      a second signal layer over the second ground layer;
      a third ground layer over the second signal layer;
      a third signal layer over the second ground layer;
      a fourth ground layer over the third signal layer;
      a first power layer over the fourth ground layer;
      a fifth ground layer over the second power layer; and
      a top layer of the PCB over the fifth ground layer.

2. The single-board computer system of claim 1, wherein the layout stack-up of the bottom side of the PCB comprises:
   a bottom layer of the PCB;
   a first ground layer over the bottom layer;
   a first power layer over the first ground layer;
   a second power layer over the first power layer;
   a second ground layer over the second power layer;
   a first signal layer over the second power layer;
   a third ground layer over the first signal layer;
   a second signal layer over the third ground layer;
   a fourth ground layer over the second signal layer;
   a third signal layer over the fourth ground layer; and
   a fifth ground layer over the third signal layer.

3. The single-board computer system of claim 1, wherein the single-board computer system is configured to execute greater than 5400 Giga-Operations Per Second (COPS).

4. The single-board computer system of claim 1, wherein the first FPGA and the second FPGA are both Xilinx devices.

5. The single-board computer system of claim 1, wherein and a layout stack-up of the printed circuit board comprises twenty-two layers including ten ground layers, four power layers, six signal layers, a top layer, and a bottom layer.

6. The single-board computer system of claim 1, wherein the plurality of peripheral components mounted on the bottom side include a voltage/frequency oscillator, at Least one voltage regulator, and at least one electrical interface.

7. The single-board computer system of claim 1, wherein the layout stack-up of the PCB comprises ground layers adjacent a center of the PCB.

8. The single-board computer system of claim 1, wherein the layout stack-up of the PCB comprises ground layers adjacent to the top layer of the PCB.

9. The single-board computer system of claim 1, comprising at least one through-hole via connecting the FPGA device to a signal layer on the bottom side of the PCB.

10. The single-board computer system of claim 9, wherein a placement of a plurality of peripheral components on the bottom side of the PCB localizes the at least one through-hole via connecting the FPGA device to the signal layer under the peripheral components.

11. A multi-layer printed circuit board (PCB) for a single board radiation hardened processing system, the multi-layer PCB comprising:
   a top half;
   a bottom half;
   a center plane therebetween; and
   a layout stack-up of the multi-layer printed circuit board, the Layout stack-up comprising:
      a plurality of ground layers,
      a plurality of signal layers, and
      a pair of power layers on the top half and the bottom half of the PCB; a top layer and a bottom layer of the PCB including a plurality of land pads configured to connect electrical components to the PCB, the printed circuit board comprising a plurality of layers arranged symmetrically in a two-halves configuration above and below a central plane of the printed circuit board, a reconfigurable field programmable gate array (FPGA) device, wherein the FPGA device comprises a first FPGA and a second FPGA, disposed on the top side of the multi-layer PCB;
   a connector disposed on the top side of the multi-layer PCB; and
   a plurality of peripheral components mounted on the bottom side of the multi-layer PCB, wherein AC coupling capacitors are configured to select routing between the first FPGA and the second FPGA, and the single board radiation hardened processing system is configured to execute greater than 5400 Giga-Operations Per Second (GOPS).

* * * * *